United States Patent
Pass et al.

(10) Patent No.: US 8,658,454 B2
(45) Date of Patent: Feb. 25, 2014

(54) METHOD OF FABRICATING A SOLAR CELL

(75) Inventors: Thomas Pass, San Jose, CA (US);
Robert Rogers, Santa Clara, CA (US)

(73) Assignee: SunPower Corporation, San Jose, CA (US)

( * ) Notice: Subject to any disclaimer, the term of this patent is extended or adjusted under 35 U.S.C. 154(b) by 579 days.

(21) Appl. No.: 12/886,393

(22) Filed: Sep. 20, 2010

(65) Prior Publication Data
US 2012/0067406 A1   Mar. 22, 2012

(51) Int. Cl.
*H01L 21/00* (2006.01)

(52) U.S. Cl.
USPC ............. 438/57; 136/255; 136/256; 438/537; 438/542

(58) Field of Classification Search
USPC ....................... 136/255, 256; 438/57, 537, 542
See application file for complete search history.

(56) References Cited

U.S. PATENT DOCUMENTS

| | | | | |
|---|---|---|---|---|
| 6,096,124 | A * | 8/2000 | Wong et al. | 106/31.43 |
| 7,368,797 | B2 * | 5/2008 | Nagashima et al. | 257/461 |
| 2007/0238216 | A1 * | 10/2007 | Park | 438/57 |
| 2008/0035198 | A1 | 2/2008 | Teppe et al. | |
| 2009/0017606 | A1 | 1/2009 | Fath et al. | |
| 2009/0235980 | A1 * | 9/2009 | Nishida | 136/256 |
| 2010/0012182 | A1 * | 1/2010 | Mori | 136/256 |

FOREIGN PATENT DOCUMENTS

WO   2004/023567   3/2004

OTHER PUBLICATIONS

International Search Report and Written Opinion from PCT/US2011/044737 mailed Feb. 9, 2012, 10 pgs.

* cited by examiner

*Primary Examiner* — Thanh-Truc Trinh
(74) *Attorney, Agent, or Firm* — Blakely Sokoloff Taylor Zafman LLP

(57) ABSTRACT

Methods of fabricating solar cells are described. A porous layer may be formed on a surface of a substrate, the porous layer including a plurality of particles and a plurality of voids. A solution may be dispensed into one or more regions of the porous layer to provide a patterned composite layer. The substrate may then be heated.

18 Claims, 5 Drawing Sheets

METHOD OF FABRICATING A SOLAR CELL

The invention described herein was made with Governmental support under contract number DE-FC36-07GO17043 awarded by the United States Department of Energy. The Government may have certain rights in the invention.

TECHNICAL FIELD

Embodiments of the present invention are in the field of renewable energy and, in particular, methods of fabricating solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are connected to metal contacts on the solar cell to direct an electrical current from the cell to an external circuit coupled thereto.

Efficiency is an important characteristic of a solar cell as it is directly related to the solar cell's capability to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Embodiments of the present invention allow for increased solar cell manufacture efficiency by providing novel processes for fabricating solar cell structures.

DETAILED DESCRIPTION

Figure 1:
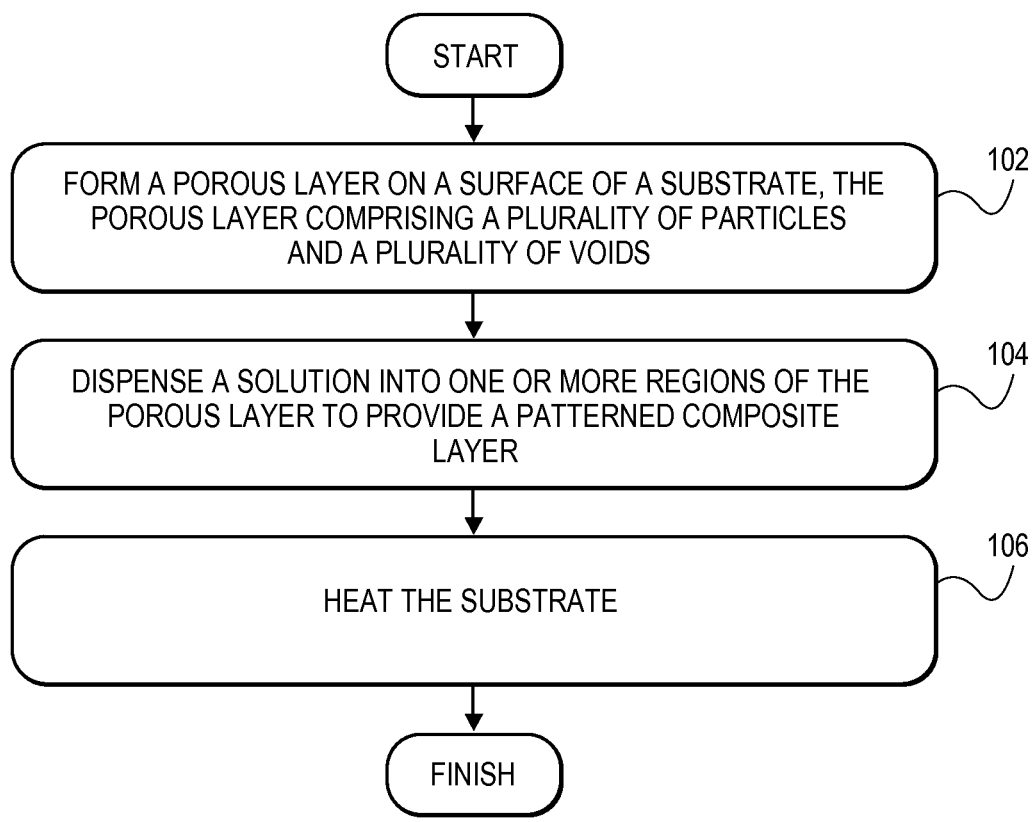
FIG. 1 illustrates a flowchart representing operations in a method of fabricating a solar cell, in accordance with an embodiment of the present invention.

Methods of fabricating solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as metal contact formation techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of fabricating solar cells. In one embodiment, a method of fabricating a solar cell includes forming a porous layer on a surface of a substrate. The porous layer includes a plurality of particles and a plurality of voids. A solution is dispensed into one or more regions of the porous layer to provide a patterned composite layer. The substrate is then heated. In an embodiment, the porous layer is a solvent absorbing layer. In one embodiment, a method of fabricating a solar cell includes forming a porous layer on a surface of a substrate. The porous layer includes a plurality of particles and a plurality of voids. A solution is dispensed into one or more regions of the porous layer to provide a patterned composite layer. The solution includes a dopant source of charge carrier impurity atoms for the substrate. In an embodiment, the porous layer is a solvent absorbing layer.

Also disclosed herein are solar cells. In one embodiment, a solar cell includes a substrate. The solar cell also includes a porous layer disposed on a surface of the substrate, the porous layer including a plurality of particles and a plurality of voids. In an embodiment, the porous layer is a solvent absorbing layer.

Porous surface mixtures are used in paper manufacturing to improve print resolution. However, improving resolution is the primary function of the mixtures when used in such applications and the entire porous layer remains in place after printing. In accordance with an embodiment of the present invention, a new interaction is created between a porous mixture and a dopant material such that subsequent etch processes create a pattern printed, doped, and topologically improved coating by removal of the porous surface material.

In accordance with an embodiment of the present invention, it is desirable to produce small precise patterns on a substrate or on a layer disposed on a substrate used in the fabrication of a solar cell, e.g., for providing doping sources. However, if using an ink-jet approach, the liquid dopant fluid tends to flow once it lands on the wafer or substrate surface, spreading across the surface. Reducing the spreading is desirable for improving resolution. In an embodiment, it is important to deposit a consistent layer onto the surface, that is, not too thick such that cracking occurs and not too thin such that the entire dopant layer is removed in post processing, such as etching. In some embodiments, the surface of the wafer or substrate has a textured surface and it is important that a relatively consistent dopant film thickness be deposited on the textured surface.

In accordance with an embodiment of the present invention, the printed qualities of a solvent based ink jetted material are improved by creating a new composite material. In one embodiment, a particulate material is deposited on a substrate or wafer surface prior to jetting. In one embodiment, a composite material is then formed to have both the solvent material and the particulate material, the composite material having properties different from either material alone. In one embodiment, a differentiation is created in the properties of the particulate material alone versus the properties of the particulate material plus solvent system to allow differential effects in post processing, such as etching. In one embodiment, particular properties of the solvent material are retained, such as dopants, after combination with the particulate material, where the particular properties were initially in the solvent material but are now in the combined material. In an embodiment, the improved print quality is achieved by means of jetting the solvent material into the open structure of a particulate material already deposited on the wafer or substrate surface. This approach forms a new, local composite material that allows for differential chemical etching or removal of the jetted versus unjetted areas at a later time. In general, in an embodiment, a new process that directly deposits patterned dopant layers onto a semiconductor wafer, or more specifically a solar cell, is provided.

In accordance with an embodiment of the present invention, the requirements for forming a solvent based ink jet material with fluid characteristics that simultaneously satisfies certain criteria are reduced. For example, in one embodiment, a dopant carrier is provided. In one embodiment, a fine lateral print resolution is provided after ink jet printing. In one embodiment, a printed layer thickness is provided with the ability to coat over non planar surface features typical on the non polished or textured surface of a silicon wafer. In one embodiment, all of the above three attributes are provided in a single approach. In accordance with an embodiment of the present invention, advantage of one or more of the approaches described herein lie in the final properties of the composite material, that is, the interaction between the open structure of a particulate material and a jetted solvent material.

Some advantages include, in one embodiment, one or more of (a) the composite material reacts differently than the non composite material under post processing conditions, such as differential etching, (b) the composite material has localized properties different from the non composite materials, (c) the composite material carries some of the properties of the solvent material such as acting as a dopant source, and (d) the composite material carries some of the properties of the particulate material such as thickness and topographical coverage. In general, in an embodiment, the final properties of the composite material are such that subsequent etch processes can create a printed, doped, and topologically improved coating that is efficient and accurate for solar cell fabrication.

In accordance with an embodiment of the present invention, a particulate material, including a particulate material in suspension or with a surface coating, is deposited over a surface. The surface is typically of a silicon solar cell that is to be subsequently printed by ink jet. The porous material is a compound of silica or other material compatible with the solar cell including materials meeting metal purity requirements.

In an embodiment, the particulate material has the deposited properties such that it is one or more of (a) an open structure after deposition such that fluids can be introduced to fill the voids, (b) adherent to the wafer surface, (c) adherent to other particles in the particulate material so that the particulate layer is partially or fully coherent to itself, (d) thick enough to cover any topological features of interest such as silicon peaks from previous process steps, or (e) chemically reactive to an etch solution. In an embodiment, the size of the particles in the particulate material are selected to have one or more of the attributes, (a) optimizing the ability of the jetted material to penetrate the matrix down to the wafer surface at the same time as it is jetted or (b) optimizing the ability of a subsequent chemical etch or similar process to dissolve and remove the particulate material where it has not received jetted material. In an embodiment, solid particulate material of a size ranging between approximately 0.01 micron and approximately 4 microns is expected to provide some of the above noted desirable properties. However, in another embodiment, a porous particulate material is similarly capable.

In accordance with an embodiment of the present invention, after deposition of the particulate material over the whole or partial surface, the surface is ink jet pattern printed with a solvent based material. The solvent based material locally penetrates and coalesces the particulate material in the printed pattern but not outside the pattern. After printing and optional firing, the surface is chemically etched or similarly processed to remove the particulate material in those areas where it was not coalesced by the solvent material. Additional embodiments of the particulate layer include, but are not limited to, (a) deposition of a continuous layer, such as Sol Gel, which changes to a porous layer upon further curing, or (b) changing the surface of the underlying layer such that it is porous upon deposition. In an embodiment, a high viscosity approach is ineffective since the printed material may bleed, reducing resolution, when down the line processing is used, such as heating.

A solar cell may be fabricated by forming a porous layer on a substrate, dispensing a solution into one or more regions of the porous layer, and heating the substrate. For example, FIG. 1 illustrates a flowchart 100 representing operations in a method of fabricating a solar cell, in accordance with an embodiment of the present invention. FIGS. 2A-2F illustrate cross-sectional views of various stages in the fabrication of a solar cell, corresponding to operations of flowchart 100, in accordance with an embodiment of the present invention.

Figure 2A:
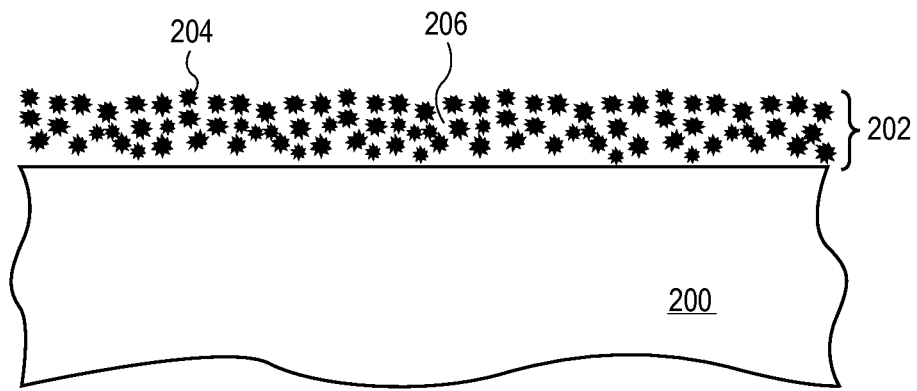
FIG. 2A illustrates a cross-sectional view of a stage in the fabrication of a solar cell, corresponding to operation 102 of the flowchart of FIG. 1 and to operation 302 of the flowchart of FIG. 3, in accordance with an embodiment of the present invention.

Referring to operation 102 of flowchart 100, and corresponding FIG. 2A, a method of fabricating a solar cell includes forming a porous layer 202 on a surface of a substrate 200. In accordance with an embodiment of the present invention, porous layer 202 includes a plurality of particles 204 and a plurality of voids 206. In one embodiment, the particles of the plurality of particles 204 are metal free or essentially metal free, or are free from metal contamination. In one embodiment, the voids of the plurality of voids 206 have an average void size approximately in the range of 0.5-10 microns. In an embodiment, porous layer 202 has a porosity approximately in the range of 30-65%. In an embodiment, forming porous layer 202 on the surface of substrate 200 includes forming each void of the plurality of voids 206 to have a dimension suitable to receive a solution, as described below, and to restrict lateral diffusion of the solution. A mechanism used for such restriction may be, but is not limited to, restriction by capillary action. It is to be understood that substrate 200 may be a layer, such as a polycrystalline silicon layer, disposed on a global solar cell substrate.

The particles of the plurality of particles 204 may be held on the surface of substrate 200 by electrostatic forces. For example, in accordance with an embodiment of the present invention, particles of the plurality of particles 204 are held on the surface of substrate 200 by inducing an electrostatic field on substrate 200. Particles may be transferred to substrate 200 with the aid of the electrostatic field. A process may be used that is common to in both powder paint and laser printers. For example, in an embodiment, surface tension is used to hold particles of the plurality of particles 204 in place relative to substrate 200. In an embodiment, porous layer 202 is a solid, and forming the porous layer 202 includes providing, as a mixture, the plurality of particles 204 and a solvent. The solvent is then evaporated to provide porous layer 202 from the mixture. In an embodiment, the entire area of a surface of substrate 200, such as the top surface of substrate 200, is covered with porous layer 202. However, in another embodiment, only a portion of the area of a surface of substrate 200 is covered, e.g., to reduce process cost.

In accordance with an embodiment of the present invention, forming porous layer 202 on substrate 204 includes forming porous layer 202 on, and conformal with, a surface of substrate 200 having a surface roughness. In one embodiment, the surface of substrate 200, such as the top surface of substrate 200, has a surface roughness with a root mean square approximately in the range of 20-30 microns. In one embodiment, porous layer 202 has a thickness approximately in the range of 0.5-20 microns. It is to be understood that a balance may be struck between a desire to control lateral diffusion of a liquid or solution in porous layer 202 as a thickness control of lateral diffusion for print resolution, versus vertical diffusion in a layer thin enough to enable a dopant solution to reach the surface of substrate 200, e.g., to reach the bottom of porous layer 202.

Figure 2B:
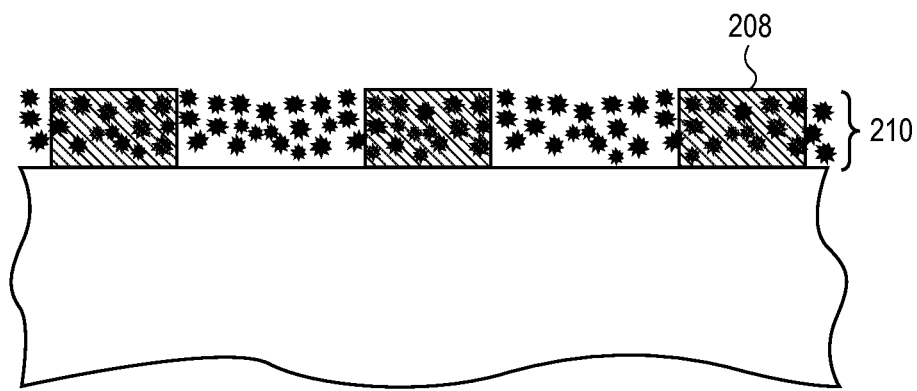
FIG. 2B illustrates a cross-sectional view of a stage in the fabrication of a solar cell, corresponding to operation 104 of the flowchart of FIG. 1 and to operation 304 of the flowchart of FIG. 3, in accordance with an embodiment of the present invention.

Referring to operation 104 of flowchart 100, and corresponding FIG. 2B, the method of fabricating a solar cell further includes dispensing a solution 208 into one or more regions of the porous layer to provide a patterned composite layer 210.

In accordance with an embodiment of the present invention, dispensing solution 208 includes using an ink-jet process. However, other embodiments may include, but are not limited to, using a wipe-on process or using a spray-on process. In an embodiment, when using an ink jet process, it is preferable to use a liquid with low viscosity for porous layer 202 (or as a medium for porous layer 202). Using a high viscosity liquid may lead to bleeding, and hence resolution reduction, or defined regions in subsequent heating operations. In one embodiment, dispensing solution 208 includes using an ink-jet process, and solution 208 is dispensed as a liquid with a viscosity of approximately 10 centipoise. In an embodiment, dispensing solution 208 includes dispensing a solution having a dopant source of charge carrier impurity atoms for substrate 200. In one embodiment, the dopant source of charge carrier impurity atoms includes N-type (e.g., with respect to a silicon substrate) charge carrier impurity atoms. In one embodiment, the dopant source of charge carrier impurity atoms includes P-type (e.g., with respect to a silicon substrate) charge carrier impurity atoms. In one embodiment, different levels of the same dopant are used and the process is repeated several times. In one embodiment, N and P dopants are co-deposited. In one embodiment, the second dopant is derived from a different source (e.g., the second dopant is included in a separate deposited layer, such as APCVD) either before or after the dispensing of solution 208, so that only one dopant source is derived from a print technique such as the methods described herein.

Figure 2C:
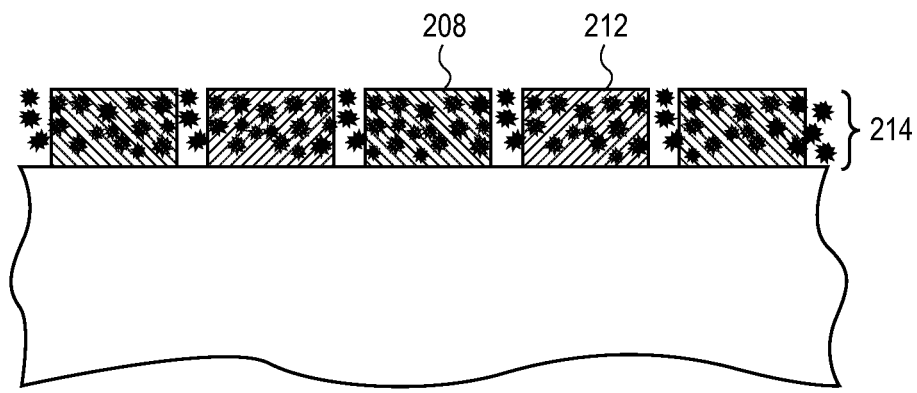
FIG. 2C illustrates a cross-sectional view of a stage in the fabrication of a solar cell, in accordance with an embodiment of the present invention.

Referring to FIG. 2C, in an optional embodiment, dispensing solution 208 includes dispensing a solution having a dopant source of charge carrier impurity atoms for substrate 200. In one such embodiment, the dopant source is an N-type dopant source for silicon, and the method further includes dispensing a second solution 212 into one or more other regions of porous layer 202 to provide a dual-patterned composite layer 214. In that embodiment, dispensing the second solution includes dispensing a solution having a P-type dopant source of charge carrier impurity atoms for substrate 200. In another such embodiment, the dopant source is a P-type dopant source for silicon, and the method further includes dispensing a second solution 212 into one or more other regions of porous layer 202 to provide a dual-patterned composite layer 214. In that embodiment, dispensing the second solution includes dispensing a solution having an N-type dopant source of charge carrier impurity atoms for substrate 200. In other embodiments, more than one solution may be dispensed to different regions of porous layer 202, where differing solutions vary on dopant concentration relative to one another. In another embodiment, although not shown, a combination of heating and printing is used to provide a dual-patterned composite layer 214 without spaces between different regions, e.g., without spaces between regions formed from first solution 208 and second solution 212.

Figure 2D:
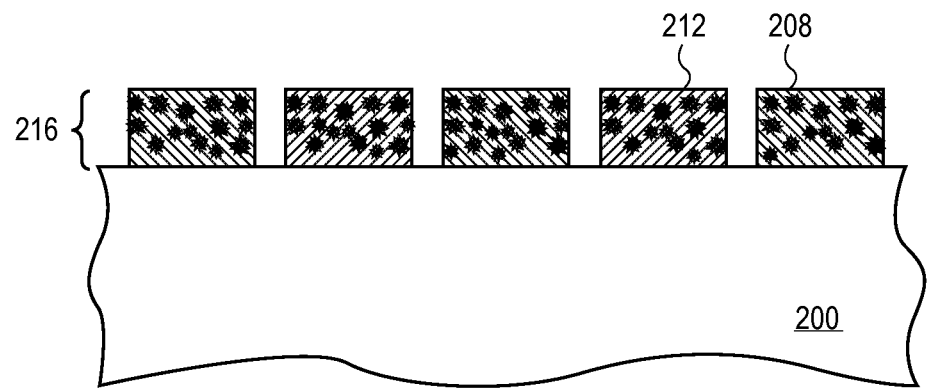
FIG. 2D illustrates a cross-sectional view of a stage in the fabrication of a solar cell, in accordance with an embodiment of the present invention.

Referring to FIG. 2D, in an optional embodiment, the method of fabricating a solar cell further includes etching all portions of porous layer 202 other than the one or more regions having the solution 208 or solutions 208 and 212. The etching exposes regions of substrate 200 and to provide etched composite layer 216. In accordance with an embodiment of the present invention, the etching is based on an etch selectivity between porous layer 202 and the one or more regions having the solution 208 or solutions 208 and 212. In one embodiment, the etch selectivity is based on a parameter such as, but not limited to, porosity or composition. In another embodiment, a removal technique other than etching is used to provide composite layer 216. In an alternative embodiment, if a combination of heating and printing is used to provide a dual-patterned composite layer 214 without spaces between different regions, an etching operation may not be relevant.

Figure 2E:
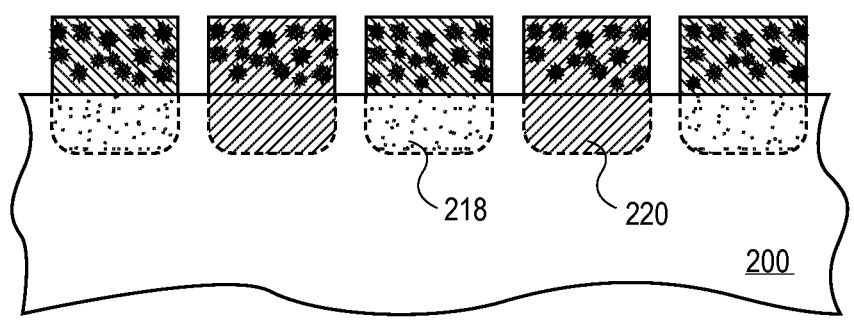
FIG. 2E illustrates a cross-sectional view of a stage in the fabrication of a solar cell, corresponding to operation 106 of the flowchart of FIG. 1, in accordance with an embodiment of the present invention.

Referring to operation 106 of flowchart 100, and corresponding FIG. 2E, a method of fabricating a solar cell further includes heating substrate 200. In accordance with an embodiment of the present invention, heating substrate 200 includes driving the charge carrier impurity atoms, such as N-type dopants, of a dopant source into substrate 200 to form regions 218. In one embodiment, heating substrate 200 further includes driving the charge carrier impurity atoms of a second solution, e.g., from a P-type dopant source, into substrate 200 to form regions 220. However, in an alternative embodiment, solution 208 (and, if used, second solution 212) is undoped or essentially dopant-free, so the primary function of the heating operation is not to drive dopants into substrate 200.

In accordance with another embodiment of the present invention, heating substrate 200 consolidates the remaining portions of porous layer 202, as described in more detail below in association with FIG. 4. In one embodiment, dopant atoms are driven into substrate 200 at a later operation. That is, a first heating step may first be used to consolidate the portions of porous layer 202 including first solution 208 and second solution 212, which may be referred to as a matrix. Subsequently, a second heating operation is performed to drive the dopants into substrate 200. In a specific embodiment, the primary purposes of the first heating are to consolidate the matrix into a solid where the solution 208 (and 212) remains in contact with substrate 200 surface and to consolidate this solid only in the regions that are matrix (e.g., not in areas of porous layer 202 that have not received a solution). In an embodiment, the heating partially consolidates portions of porous layer 202 without solution, but at least some porosity is retained for later printing or to enable selective etching away of the porous layer. In one particular embodiment, substrate 200 is heated to consolidate the matrix, an etch is then performed to remove the porous layer and, finally, substrate 200 is heated then heat to drive the dopant impurity atoms into substrate 200. In another particular embodiment, substrate 200 is heated to consolidate the matrix and the remaining portions of porous layer 202 are retained for subsequent processing. In another particular embodiment, substrate 200 is processed and heated again to consolidate or is heated to consolidate and drive dopants simultaneously. In another particular embodiment, substrate 200 is heated to drive dopants and to leave the remaining portions of porous layer 202 or to etch off the remaining portions of porous layer 202.

Figure 2F:
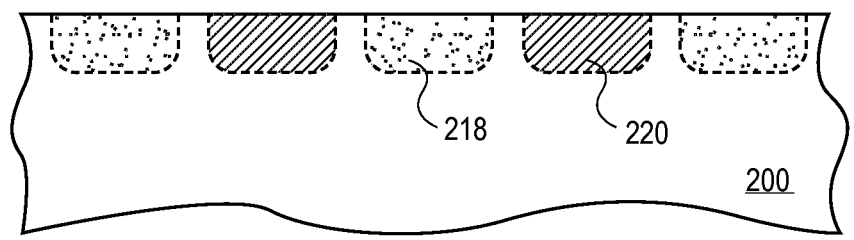
FIG. 2F illustrates a cross-sectional view of a stage in the fabrication of a solar cell, in accordance with an embodiment of the present invention.

Referring to FIG. 2F, in an optional embodiment, the method of fabricating a solar cell further includes removing all remaining portions of porous layer 202, e.g., removing etched composite layer 216. In an embodiment, the remaining portions of porous layer 202 are removed with a dry etch process. In another embodiment, the remaining portions of porous layer 202 are removed with a wet etch process. In an embodiment, the dry or wet etch process is mechanically aided.

In order to further or complete fabrication of a solar cell, the method above may further include forming a metal contact above doped regions 218 and 220 from FIG. 2F. In an embodiment, a completed solar cell is a back-contact solar cell. In that embodiment, N-type-doped region 218 and P-type-doped region 220 are active regions. Conductive contacts may be coupled to the active regions and separated from one another by isolation regions, which may be composed of a dielectric material. In an embodiment, the solar cell is a back-contact solar cell and further includes an anti-reflective coating layer disposed on a light-receiving surface, such as on a random textured surface of the solar cell. It is noted that, in an embodiment, this operation may not be performed, and a consolidated material may be retained on substrate 200, as described below in association with FIG. 4.

Figure 3:
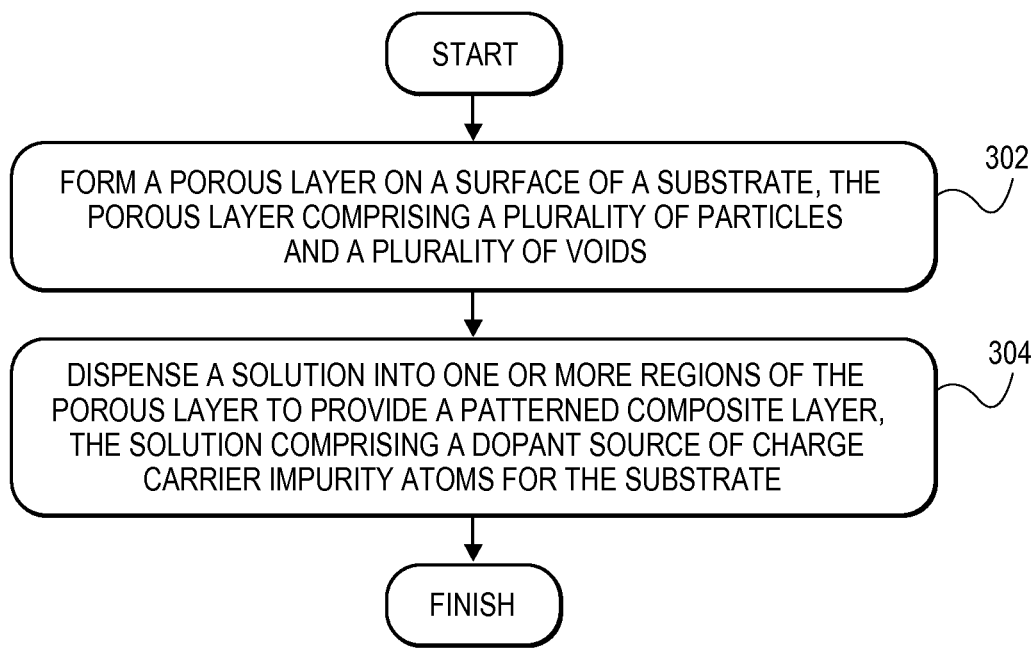
FIG. 3 illustrates a flowchart representing operations in a method of fabricating a solar cell, in accordance with an embodiment of the present invention.

In another aspect of the present invention, a solar cell may be fabricated by forming a porous layer on a substrate and dispensing a solution into one or more regions of the porous layer, the solution including a dopant source of charge carrier impurity atoms for the substrate. For example, FIG. 3 illustrates a flowchart 300 representing operations in a method of fabricating a solar cell, in accordance with an embodiment of the present invention. FIGS. 2A-2F illustrate cross-sectional views of various stages in the fabrication of solar cells, corresponding to operations of flowchart 300, in accordance with an embodiment of the present invention.

Referring to operation 302 of flowchart 300, and corresponding FIG. 2A, a method of fabricating a solar cell includes forming a porous layer 202 on a surface of a substrate 200, similar to operation 102 of flowchart 100. In an embodiment, porous layer 202 includes a plurality of particles 204 and a plurality of voids 206. In an embodiment, forming porous layer 202 on the surface of substrate 200 includes forming each void of the plurality of voids 206 to have a dimension suitable to receive a solution and to restrict lateral diffusion of the solution. In an embodiment, forming porous layer 202 on substrate 200 includes forming porous layer 202 on, and conformal with, a surface of substrate 202 having a surface roughness. In that embodiment, porous layer 202 has a thickness approximately in the range of 0.5-20 microns. In an embodiment, porous layer 202 is a solid, and forming porous layer 202 includes providing, as a mixture, the plurality of particles 204 and a solvent, followed by evaporation of the solvent to provide porous layer 202 from the mixture.

Referring to operation 304 of flowchart 300, and corresponding FIG. 2B, a method of fabricating a solar cell further includes dispensing a solution 208 into one or more regions of the porous layer to provide a patterned composite layer 210, solution 208 including a dopant source of charge carrier impurity atoms for substrate 200. In an embodiment, dispensing solution 208 includes using an ink-jet process. In one such embodiment, solution 208 is dispensed as a liquid with a viscosity of approximately 10 centipoise. In an embodiment, solution 208 includes a dopant source of charge carrier impurity atoms for a silicon substrate. For example, in one embodiment, the charge carrier impurity atoms are N-type dopants, such as but not limited to phosphorus dopants. In another embodiment, the charge carrier impurity atoms are P-type dopants, such as but not limited to boron dopants.

Referring to FIG. 2C, in an optional embodiment, the above dopant source is an N-type dopant source for silicon, and the method further includes dispensing a second solution 212 into one or more other regions of porous layer 202 to provide a dual-patterned composite layer 214. In an embodiment, dispensing second solution 212 includes dispensing a solution having a P-type dopant source of charge carrier impurity atoms for substrate 200. In one embodiment, dispensing solution 208 and second solution 212 includes dispensing both solution 208 and second solution 212 in a single pass of porous layer 202. In one embodiment, dispensing solution 208 and second solution 212 includes dispensing solution 208 (or, alternatively, second solution 212) in a first pass of porous layer 202 and dispensing second solution 212 (or, alternatively, solution 208) in a second, separate, pass of porous layer 202.

Referring to FIG. 2D, in an optional embodiment, to expose regions of substrate 200, all portions of porous layer 202 other than the one or more regions having solution 208 (and, optionally, second solution 212) are etched, the etching based on an etch selectivity between porous layer 202 and the one or more regions having solution 208 (and, optionally, second solution 212).

Referring to FIG. 2E, in an optional embodiment, the method of fabricating a solar cell further includes heating substrate 200. Referring to FIG. 2F, in an optional embodiment, all remaining portions of porous layer 202 are removed. In order to further or complete fabrication of a solar cell, the method above may further include forming a metal contact above doped regions 218 and 220 from FIG. 2F.

A porous layer, as described with respect to the above embodiments in FIGS. 1-3, may be retained on a substrate of a solar cell, or may likely be subsequently removed. Nonetheless, a solar cell structure may ultimately retain, or at least temporarily include, such a porous layer as a consequence of processing operations. For example, FIG. 4 illustrates a cross-sectional view of a substrate of a solar cell, the substrate having a porous layer formed thereon, in accordance with an embodiment of the present invention.

Figure 4:
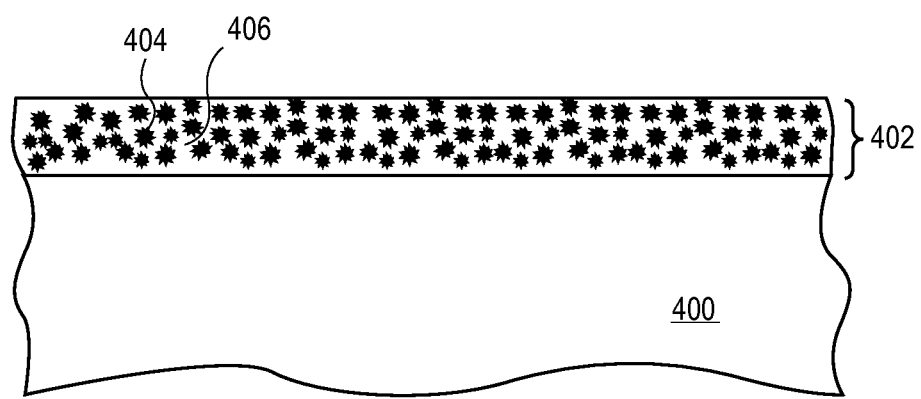
FIG. 4 illustrates a cross-sectional view of a substrate of a solar cell, the substrate having a consolidated porous layer formed thereon, in accordance with an embodiment of the present invention.

Referring to FIG. 4, a solar cell includes a substrate 400. A consolidated porous layer 402 is disposed on a surface of substrate 400. Consolidated porous layer 402 includes a plurality of particles 404 and a plurality of voids 406. In accordance with an embodiment of the present invention, portions of consolidated porous layer 402 are not removed in process operations used to fabricate the solar cell, but rather remain as an artifact on the surface of substrate 400, or on a layer or stack of layers above a global substrate.

Thus, methods of fabricating solar cells have been disclosed. In accordance with an embodiment of the present invention, a method of fabricating a solar cell includes forming a porous layer on a surface of a substrate, the porous layer including a plurality of particles and a plurality of voids. The method also includes dispensing a solution into one or more regions of the porous layer to provide a patterned composite layer. The method also includes heating the substrate. In one embodiment, dispensing the solution includes dispensing a solution having a dopant source of charge carrier impurity atoms for the substrate. In a specific embodiment, heating the substrate includes driving the charge carrier impurity atoms of the dopant source into the substrate.

What is claimed is:

1. A method of fabricating a solar cell, the method comprising:
    forming a porous layer on a surface of a substrate, the porous layer comprising a plurality of particles and a plurality of voids;
    dispensing a solution into first and second regions, but not into a region between the first and second regions, of the porous layer to provide a patterned composite layer;
    etching to remove the region between the first and second regions without etching the first and second regions; and, subsequently,
    heating the substrate.

2. The method of claim 1, wherein heating the substrate comprises consolidating the patterned composite layer.

3. The method of claim 1, wherein dispensing the solution comprises dispensing a solution comprising a dopant source of charge carrier impurity atoms for the substrate.

4. The method of claim 3, wherein heating the substrate comprises driving the charge carrier impurity atoms of the dopant source into the substrate.

5. The method of claim 4, wherein the dopant source is an N-type dopant source for silicon, the method further comprising:
    dispensing a second solution into one or more other regions of the porous layer to provide a dual-patterned composite layer, wherein dispensing the second solution comprises dispensing a solution comprising a P-type dopant source of charge carrier impurity atoms for the substrate, and wherein heating the substrate further comprises driving the charge carrier impurity atoms of the P-type dopant source into the substrate.

6. The method of claim 1, wherein forming the porous layer on the surface of the substrate comprises forming each void of the plurality of voids to have a dimension suitable to receive the solution at the surface of the substrate and to restrict lateral diffusion of the solution.

7. The method of claim 1, wherein dispensing the solution comprises using an ink jet process.

8. The method of claim 7, wherein the solution has a viscosity of approximately 10 centipoise.

9. The method of claim 1, wherein forming the porous layer on the substrate comprises forming the porous layer on, and conformal with, a surface having a surface roughness, wherein the porous layer has a thickness approximately in the range of 0.5-20 microns.

10. The method of claim 1, wherein the porous layer is a solid, and wherein forming the porous layer comprises:
    providing, as a mixture, the plurality of particles and a solvent; and
    evaporating the solvent to provide the porous layer from the mixture.

11. A method of fabricating a solar cell, the method comprising:
    forming a porous layer on a surface of a substrate, the porous layer comprising a plurality of particles and a plurality of voids;
    dispensing a solution into first and second regions, but not into a region between the first and second regions, of the porous layer to provide a patterned composite layer, the solution comprising a dopant source of charge carrier impurity atoms for the substrate; and
    etching to remove the region between the first and second regions without etching the first and second regions.

12. The method of claim 11, wherein the dopant source is an N-type dopant source for silicon, the method further comprising:
    dispensing a second solution into one or more other regions of the porous layer to provide a dual-patterned composite layer, wherein dispensing the second solution comprises dispensing a solution comprising a P-type dopant source of charge carrier impurity atoms for the substrate.

13. The method of claim 12, wherein dispensing the solution and the second solution comprises dispensing both the solution and the second solution in a single pass of the porous layer.

14. The method of claim 12, wherein dispensing the solution and the second solution comprises dispensing the solution in a first pass of the porous layer and dispensing the second solution in a second, separate, pass of the porous layer.

15. The method of claim 11, wherein forming the porous layer on the surface of the substrate comprises forming each void of the plurality of voids to have a dimension suitable to receive the solution at the surface of the substrate and to restrict lateral diffusion of the solution.

16. The method of claim 11, wherein dispensing the solution comprises using an ink jet process.

17. The method of claim 11, wherein forming the porous layer on the substrate comprises forming the porous layer on, and conformal with, a surface having a surface roughness, wherein the porous layer has a thickness approximately in the range of 0.5-20 microns.

18. The method of claim 11, wherein the porous layer is a solid, and wherein forming the porous layer comprises:
    providing, as a mixture, the plurality of particles and a solvent; and
    evaporating the solvent to provide the porous layer from the mixture.

* * * * *